United States Patent [19]
Benzing et al.

[11] Patent Number: 5,405,480
[45] Date of Patent: Apr. 11, 1995

[54] INDUCTION PLASMA SOURCE

[75] Inventors: Jeffrey C. Benzing, Saratoga; Eliot K. Broadbent; J. Kirkwood H. Rough, both of San Jose, all of Calif.

[73] Assignee: Novellus Systems, Inc., Calif.

[21] Appl. No.: 273,574

[22] Filed: Jul. 11, 1994

Related U.S. Application Data

[63] Continuation-in-part of Ser. No. 971,363, Nov. 4, 1992, Pat. No. 5,346,578.

[51] Int. Cl.⁶ .................................................. H01L 21/00
[52] U.S. Cl. ...................................... 156/345; 156/643
[58] Field of Search ............... 118/723 I, 723 IR, ; 156/345, 643; 315/111.51; 204/298.34, 192.32

[56] References Cited

U.S. PATENT DOCUMENTS

| | | | |
|---|---|---|---|
| H566 | 6/1989 | Nyaiesh et al. | |
| 4,362,632 | 12/1982 | Jacob | 422/183.04 |
| 4,421,592 | 12/1983 | Shuskus | 156/613 |
| 4,431,901 | 2/1984 | Hull | 219/121 |
| 4,686,113 | 8/1987 | Delfino | 118/723 |
| 4,786,352 | 11/1988 | Benzing | 156/345 |
| 4,810,935 | 3/1989 | Boswell | 315/111.41 |
| 4,844,775 | 7/1989 | Keeble | 156/643 |
| 4,867,952 | 9/1989 | Baumann | 423/210 |
| 4,948,458 | 8/1990 | Ogle | 156/643 |
| 5,018,479 | 5/1991 | Markunas | 118/723 |
| 5,063,175 | 11/1991 | Broadbent | 437/192 |
| 5,122,251 | 6/1992 | Campbell | 202/298.06 |
| 5,346,578 | 9/1993 | Benzing | 156/345 |

FOREIGN PATENT DOCUMENTS

| | | | |
|---|---|---|---|
| 0489407A3 | 6/1992 | European Pat. Off. | |
| 0091085 | 8/1978 | Japan | 118/723 |
| 0064124 | 4/1986 | Japan | 118/723 |
| 61-266567 | 11/1986 | Japan | |
| 3014862 | 1/1988 | Japan | 118/723 |
| 63-270469 | 11/1988 | Japan | |
| 63-317675 | 12/1988 | Japan | |
| 0057600 | 3/1989 | Japan | 315/11121 |
| 2231197 | 11/1990 | United Kingdom | |
| 910352 | 1/1982 | U.S.S.R. | |

Primary Examiner—R. Bruce Breneman
Assistant Examiner—Joni Y. Chang
Attorney, Agent, or Firm—Skjerven, Morrill, MacPherson, Franklin & Friel

[57] ABSTRACT

An induction plasma source for integrated circuit fabrication includes a hemispherically shaped induction coil in an expanding spiral pattern about the vacuum chamber containing a semiconductor wafer supported by a platen. The windings of the induction coil follow the contour of a hemispherically shaped quartz bell jar, which holds the vacuum. The power source is a low frequency rf source having a frequency of about 450 KHz and a power in the range of 200–2000 watts, and the pressure is a low pressure of about 0.1–100 mTorr. A high frequency rf source independently adjusts the bias voltage on the wafer.

31 Claims, 6 Drawing Sheets

INDUCTION PLASMA SOURCE

CROSS-REFERENCE TO RELATED APPLICATIONS

This application is a continuation in part of application Ser. No. 07/971,363, filed Nov. 4, 1992, now U.S. Pat. No. 5,346,578.

BACKGROUND OF THE INVENTION

1. Field of the Invention

The present invention relates to plasma sources, and more particularly to induction plasma sources for integrated circuit fabrication.

2. Description of Related Art

Plasma etching is useful in many fields, but particularly in the field of microelectronic fabrication. Microelectronic fabrication of integrated circuits requires mass replication of tightly controlled, submicron-sized features in a variety of materials, as well as selective removal of material without causing damage to sensitive structures and remaining materials. Illustrative application of plasma etching to microelectronic fabrication of integrated circuits includes ion sputter cleaning, dielectric gap filling involving simultaneous chemical vapor deposition ("CVD") and etch, chemical blanket etchback without resist, and chemical pattern etch with resist.

Various plasma source methods and geometric designs for reactors are known for use in plasma deposition and etching. For example, electron cyclotron resonance ("ECR") sources are available from Applied Science and Technology, Inc., Woburn, Mass. and from the WAVEMAT Corporation, Plymouth, Mass. Also, wafer cleaning and etching processes have commonly been done with equipment using various cylindrical shaped quartz vessels of various diameters having induction windings of various pitches, either constant or variable, as well as with flat spiral induction windings mounted above the dielectric chamber top plate. Radio frequency ("rf") diode and triode configurations are also known in which the wafer electrode and possibly other electrodes are powered at 13.56 MHz to produce the plasma.

Physical sputtering, one of several plasma etching mechanisms, involves the removal of material by energetic ions, which cross the sheath and transfer energy and momentum to the material being etched. As implemented on a great many of the prior art inductively coupled cavity and/or diode and triode machines, physical sputtering suffers from a number of disadvantages, including low material removal rate, poor etch uniformity due to poor ion current uniformity, and electrical damage to the substrate from ion bombardment and implantation due to high ion energies. The ECR sources provide improved performance, but with considerably greater complexity than induction-type sources.

Hence, a need continues for plasma source systems that are able to provide good ion density to achieve high etch rates, ion current uniformity to achieve uniform removal of material over large diameter substrates, and operational stability at low pressure to achieve a more uniform ion distribution in the plasma and better directionality of ions in high aspect ratio structures, all in a generally simple machine implementation.

SUMMARY OF THE INVENTION

The present invention achieves high ion density, good ion current uniformity, and stable low pressure operation in a generally simple machine implementation.

In one embodiment of the present invention, an induction plasma source, the induction coil is hemispherical in shape. A chamber into which a substrate may be introduced is disposed inside the induction coil. In a further embodiment, the induction coil follows the contour of a hemispherically shaped vessel, which contains the chamber. In yet a further embodiment, the power source is a low frequency source having a frequency of about 450 KHz and a power in the range of 200–2000 watts, and the pressure is a low pressure of about 0.1–100 mTorr.

DESCRIPTION OF THE PREFERRED EMBODIMENT

Figure 1:
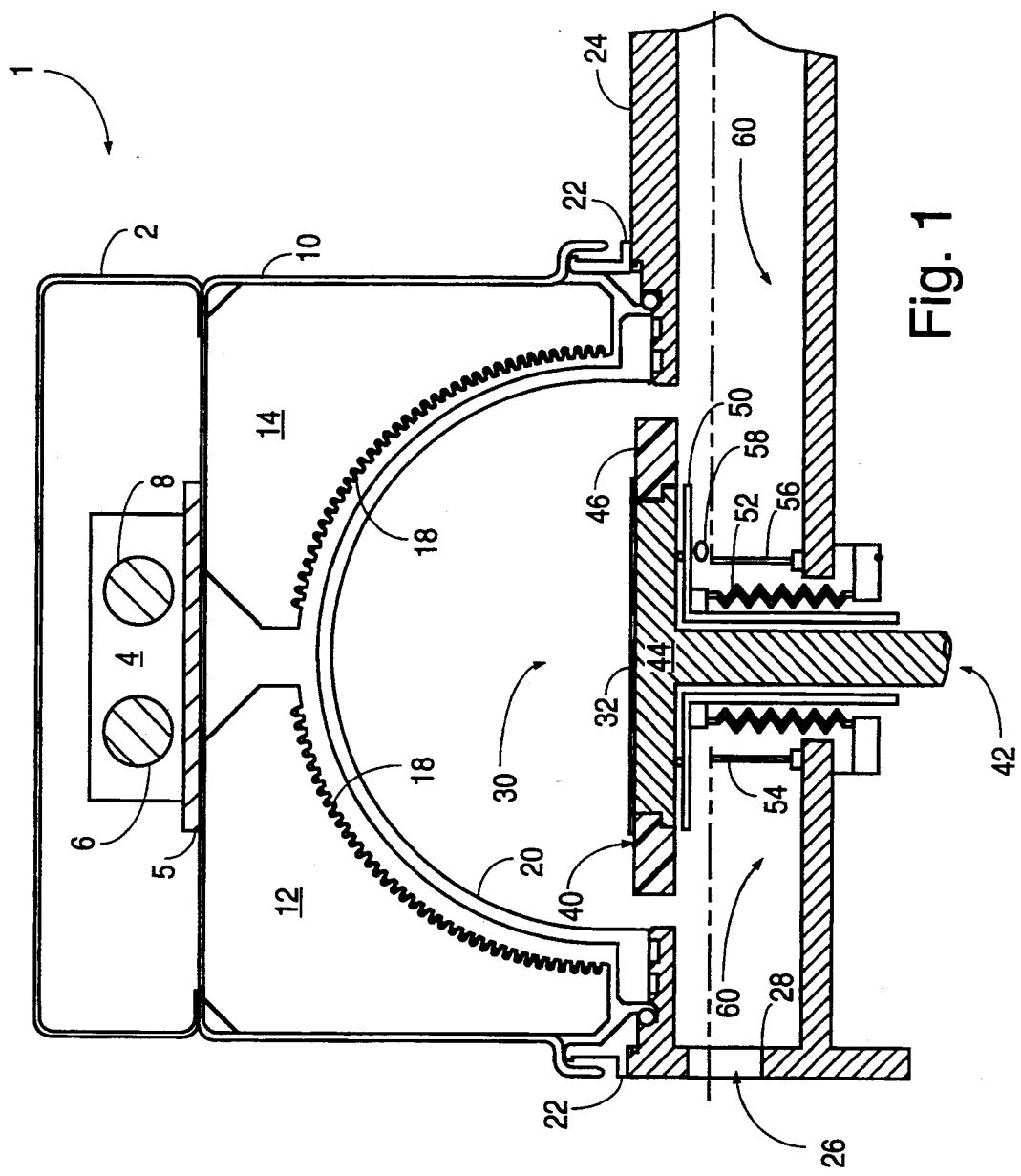
FIG. 1 is a cross-section view of a hemispherical induction plasma source and related components of a plasma etch system.
Figure 2:
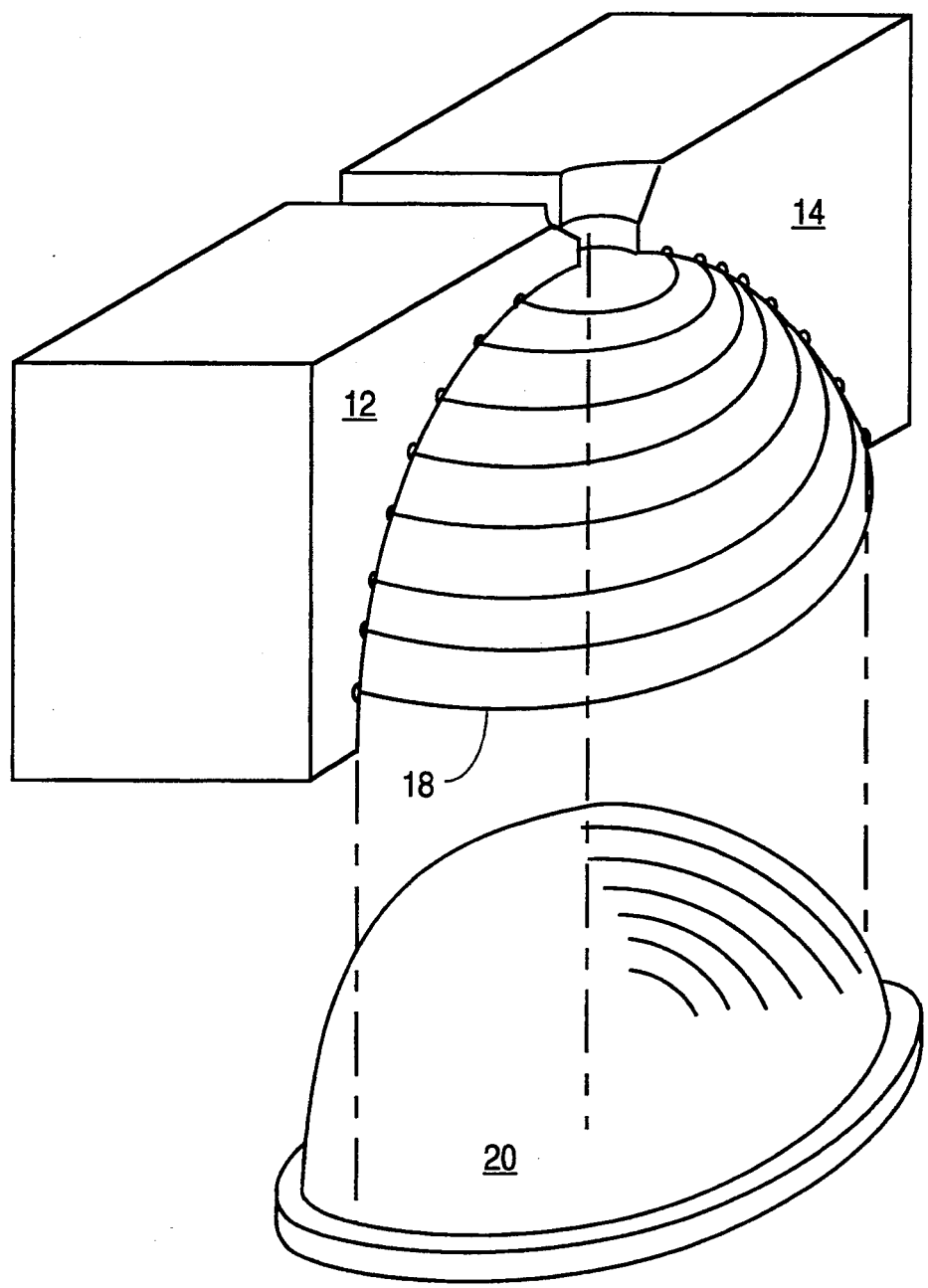
FIG. 2 is a perspective cut-away view of the hemispherical induction plasma source of FIG. 1.

A hemispherical induction plasma source 1 is shown in cross-section in FIG. 1 and in a simplified perspective in FIG. 2. The hemispherical induction plasma source 1 is contained within a stainless steel source housing 10 measuring 26.62 cm high and 43.82 cm wide, and includes a hemispherical induction coil 18 that is provided in an expanding spiral pattern on four winding forms—only forms 12 and 14 are illustrated for clarity. Four forms are used to simplify assembly of the induction coil 18, although other form types such as a unitary form are suitable as well, depending on the manufacturing techniques employed. The winding forms, e.g. forms 12 and 14, are made of any suitable material, which include dielectric materials such as nylon. The induction coil 18 is held in place inside channels in the winding forms, e.g. 12 and 14, by any suitable dielectric strapping, adhesive, or cement. Particular advantages in temperature control of a manufacturing process are achieved by holding the induction coil 18 in place using a thermally conductive material. One thermally conductive material is a thermally conductive elastomer, for example Sylgard ® Q3-6605 Thermally Conductive Elastomer, which is available from Dow Corning Corporation, Midland, Mich. The winding forms, including forms 12 and 14, are securely attached to the housing 10 in any convenient manner, as by bolts or adhesive.

The induction coil 18 is copper tubing having an inner diameter of 3.0 mm and an outer diameter of 4.75 mm. The hemispherical induction coil 18 has a radius to centerline of 7.75 cm. The expanding spiral pattern of the induction coil 18 is made of thirty-six windings. The first winding is nearly coplanar with substrate 32 and each subsequent winding spirals upward with a 2.432 degree angular displacement for a total of 36 coils.

During processing operations, the induction coil 18 is positioned about a vacuum chamber 30 contained within a quartz vessel or bell jar 20, in conjunction with a stainless steel chamber top plate 24 of any suitable thickness, illustratively 1.91 cm thick. Preferably, the vessel 20 is hemispherically shaped so that there is a balanced coupling of rf (uniform dielectric spacing) into the vacuum cavity. Generally, the vessel material is an insulating dielectric having sufficient structural integrity to withstand a vacuum. Suitable materials include quartz, pyrex, aluminum oxide ($Al_2O_3$, also known as sapphire), polyamide, and other oxide or nitride composites. Illustratively, the radius of the vessel 20 is 17.78 cm, and the vessel material is quartz having a thickness of 0.51 cm. The induction coil 18 follows the hemispherical contour of the vessel 20, which is capable of holding a vacuum and contains the substrate, illustratively a semiconductor wafer 32 containing integrated circuit chips in fabrication.

The housing 10 is mounted onto the chamber top plate 24 in any convenient manner. FIG. 1 shows the housing 10 as being engaged by an rf seal 22, which includes copper leaves to prevent spurious rf emissions from the induction plasma source 1.

The semiconductor wafer 32, illustratively 200 mm in diameter, is supported within the chamber 30 by an electrically conductive (e.g. stainless steel) wafer support pedestal 42 that includes a platen 40 having a stainless steel portion 44 underlying the wafer 32 and a ceramic dark space ring 46 extending beyond and in the plane of the platen portion 44. The diameter of the portion 44 is 18.35 cm, and the outer diameter of the dark space ring 46 is 28.62 cm. Under the platen 40 is a dark space shield 50, which has an outer diameter of 20.32 cm.

The pedestal 42 is capable of vertical motion, which is imparted by any suitable mechanism (not shown). The position of the pedestal depends on whether the plasma etch system is operating in process mode or in wafer transfer mode. In process mode, the platen 40 is positioned within the chamber 30, as shown in FIG. 1. Bellows 52, which is provided to isolate the mechanical components of the pedestal drive system at atmospheric pressure from the vacuum in chambers 30 and 60, is well extended. The wafer 32 rests on the pedestal 40, within the process chamber 30.

For wafer unloading and loading, the pedestal 40 is lowered into a wafer transfer region 60, which is 7.54 cm in height and includes at one end a sealable wafer transfer opening 26 having a height of 4.60 cm. The bellows 52 is well compressed, and three lifter pins—only pins 54 and 56 are shown—protrude through holes (not shown) in the platen 40 so as to support the wafer 32 in a stationary position within the transfer region 60 as the pedestal 42 lowers. The sealable wafer transfer opening 26 is provided to permit a wafer transport arm (not shown) access beyond the wafer transfer flange 28 into the transfer region 60 during wafer transfer mode. Suitable wafer transport arms and associated mechanisms are well known in the art. In a wafer transfer operation, tines on the end of the transport arm are inserted under the wafer 32 as it is supported by the lifter pins (e.g. pins 54 and 56). The transport arm is raised to lift the wafer 32 off of the lifter pins, so that when the transport arm is retracted, the wafer 32 is removed from the transfer region 60. A new wafer is substituted on the tines, and the transport arm is then moved into a position over the lifter pins (e.g. 54 and 56). The transport arm is lowered to deposit the wafer 32 onto the lifter pins, and then withdrawn. The pedestal 42 is raised to cause the wafer 32 to be deposited on the platen 40.

The induction source 1 is suitable for use in a variety of applications, including ion sputter clean, chemical blanket etchback, chemical pattern etch, and plasma-enhanced chemical vapor deposition ("PECVD"). Ion sputter clean involves the use of a plasma obtained from a suitable inert gas such as argon at low pressure to remove material from the surface of the substrate by momentum transfer. In the illustrative arrangement of the induction system 1 for etch clean shown in FIG. 1, argon gas is introduced into the chamber 30 through a single port 58 (FIG. 1) located in the chamber sidewall just below the platen 40. Chemical etching uses reactive gases instead of an inert gas in typically a higher pressure regime than an ion sputter clean, and is suitable for etchback or for pattern etch where a photoresist or other masking material is present. Because of the higher pressure or greater reactivity of species, an arrangement of the induction system for chemical etching (not shown) preferably uses a symmetrical multiple port arrangement about the substrate for introducing the reactive gases. PECVD uses different reactive gases that induce film deposition. An arrangement of the induction system for PECVD (not shown) preferably uses the symmetrical multiple port arrangement. When used with careful substrate bias control, the induction system for PECVD is suitable for dielectric gap filling.

A vacuum system (not shown) of any suitable type is connected to the transfer region 60 for evacuating the chamber 30. Suitable vacuum systems are well known in the art. After chamber 30 is evacuated, process gas, which for an ion sputter clean is preferably argon, is furnished to the chamber 30 through the port 58 to attain a desired pressure of process gas. Illustratively for an ion sputter clean, sufficient argon is introduced to establish a low pressure in the range of about 0.1–100 mTorr, and preferably 0.1–10 mTorr.

The radio frequency ("rf") subsystem of the induction plasma source 1 includes matching capacitors 6 and 8, which are enclosed within a stainless steel rf match enclosure 2. Capacitors 6 and 8 are connected to bus bars (only bus bar 4 shown), and the assembly is mounted onto a dielectric block 5 which is mounted on the housing 10.

Figure 3:
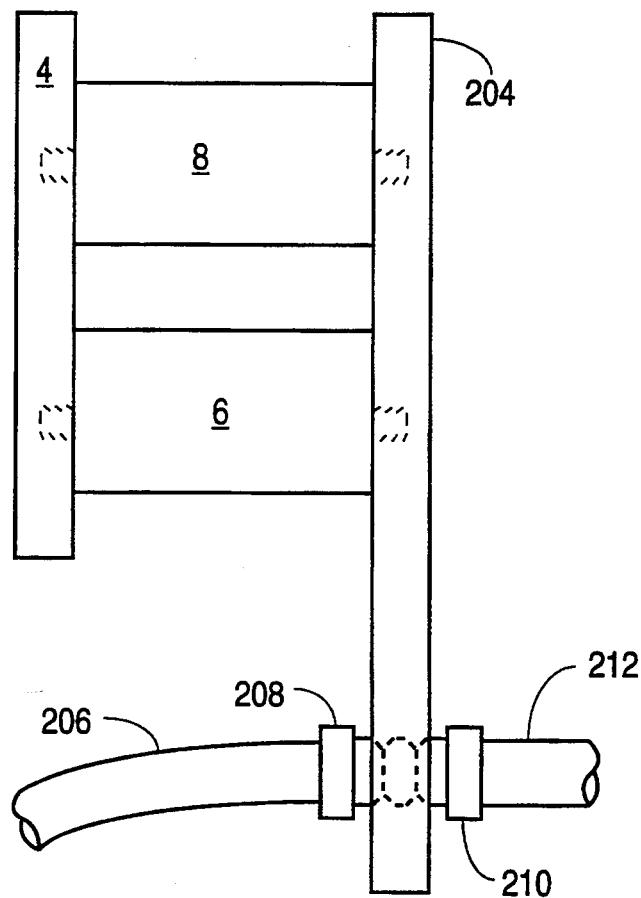
FIG. 3 is a plan view of the connection between the hemispherical inductor and the rf matching network of FIG. 1.
Figure 4:
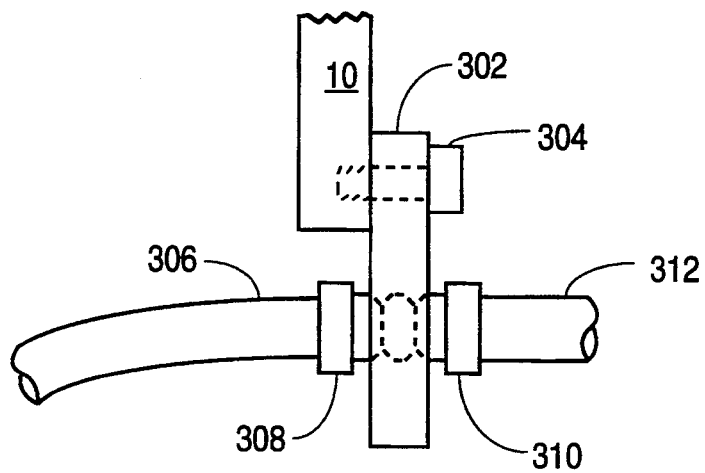
FIG. 4 is a plan view of the connection between the hemispherical inductor and the plasma chamber of FIG. 1.
Figure 5:
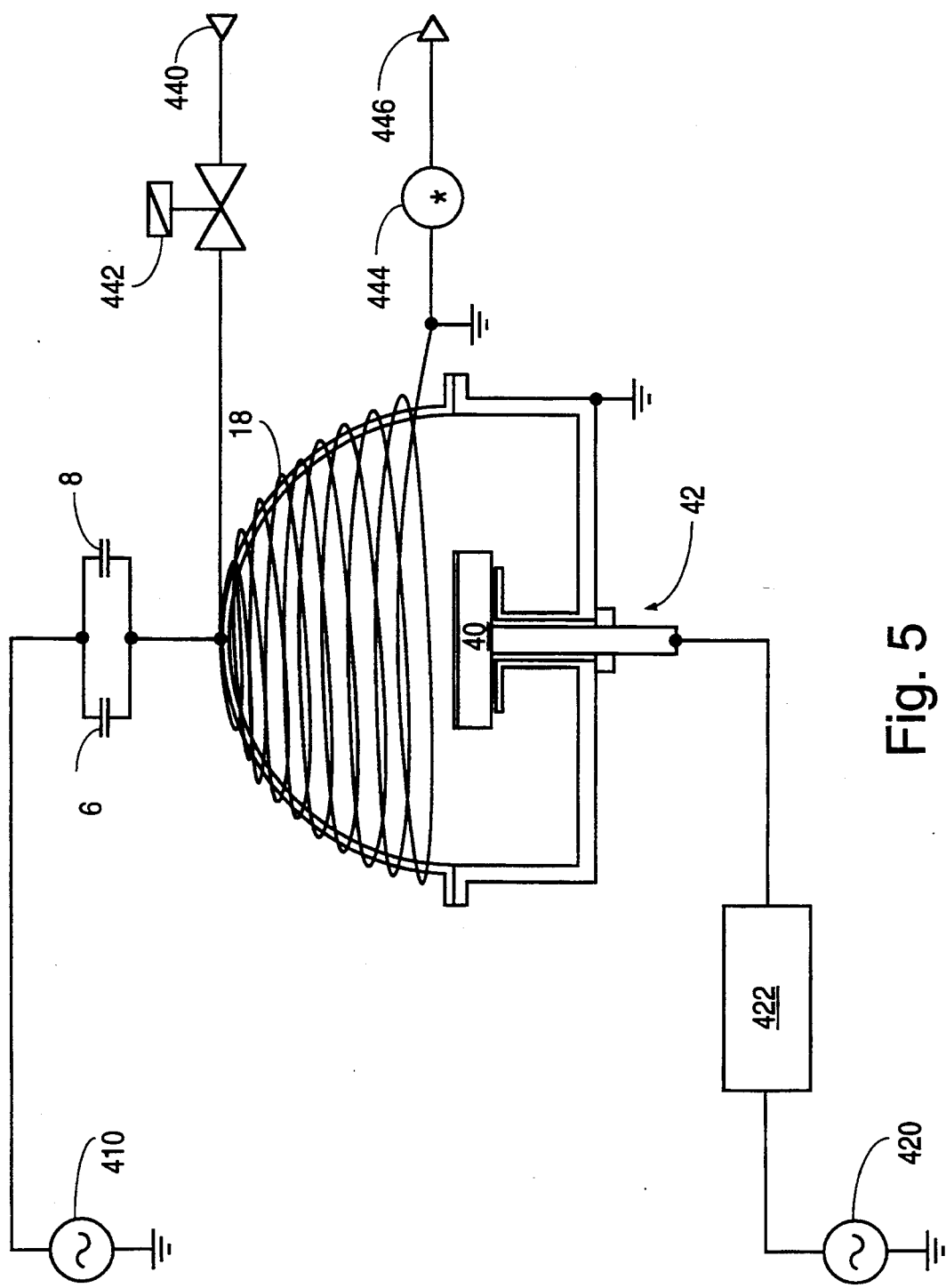
FIG. 5 is an equivalent circuit of the hemispherical induction plasma source of FIG. 1.

The induction coil 18 is coupled to the rf matching network capacitors 6 and 8 as shown in the detail of FIG. 3. Capacitors 6 and 8 each have one terminal screwed into the copper bus bar 4 and the other terminal screwed into copper bus bar 204. Bus bar 4 is connected to the low frequency source 410 (FIG. 5). Bus bar 204 is connected to end 206 of the copper tubing of which the induction coil 18 is formed through fitting 208. Fitting 208 is screwed into a channel through the bus bar 204. Another fitting 210 is screwed into the other end of the channel. Teflon tubing 212 is connected to the fitting 210 for delivering a cooling fluid. The induction coil 18 is coupled to the grounded top plate 24 as shown in the detail of FIG. 4. Bus bar 302 is bolted to the housing 10 by bolt 304, and is connected to end 306 of the copper tubing of which the induction coil 18 is formed through fitting 308. Fitting 308 is screwed into a channel through the bus bar 302. Another fitting 310 is screwed into the other end of the channel. Teflon tubing 312 is connected to the fitting 310 for draining a cooling fluid.

The rf subsystem of the induction plasma source 1 is represented in FIG. 5. The power source includes a low frequency source 410 and a high frequency source 420. The low frequency source 410 has a frequency of about 450 KHz and a power in the operating range of 200-2000 watts. The low frequency source 410 is connected to the induction wiring 18 through a low frequency matching network that includes the capacitors 6 and 8, connected in parallel. The low frequency matching network is tuned to couple low frequency rf energy into the plasma cavity in accordance with the cavity shape, pressure, and plasma chemistry, in a manner well known in the art. Illustratively in this embodiment, capacitors 6 and 8 are transmitting-type mica capacitors, each having a value of 1200 pf at 6000 rated volts. The high frequency source 420 has a frequency of about 13.56 MHz and a power in the operating range of 25-500 watts. The high frequency source 410 is connected to the platen 40 through an autotune high frequency matching network 422 such as, for example, model AM-5, available from RF Plasma Products, Inc. of Kresson, N.J. The autotune matching network 422 has an internal dc bias control that allows a regulated bias voltage at the wafer 32 to be achieved.

The induction coil 18 is cooled by any suitable liquid, an example of which is chilled water. Chilled water is introduced to the induction coil 18 from source 440 through valve 442, and is returned to sink 446 through flow switch 444. Illustratively, the chilled water is delivered at a pressure in the range of 3-5 bars, for example.

During fabrication of integrated circuits, the vessel or jar 20 endures thermal cycling. A chamber vessel is constructed from an insulating dielectric material so that cooling of the chamber is difficult and heating is significant. Temperature increases of 300° F. to 400° F. are typical in a conventional chamber, which tends to cause the insulating dielectric material to delaminate or flake, disadvantageously resulting in particulate generation in the chamber.

However in the illustrative embodiment of the chamber 30, the cooling effect of the cooling fluid is augmented when the induction coil 18 is packed ("potted") in a thermally conductive material having a high dielectric strength so that both the coil 18 and the quartz vessel or bell jar 20 are cooled. Temperature control of the quartz vessel or bell jar 20 is improved and temperature excursions are typically reduced to less than 100° F. in continuous operation.

Although the induction plasma source 1 is mechanically uncomplicated and relatively simple to manufacture, it advantageously achieves high ion density, good ion current uniformity, and stable low pressure operation. When used for argon ion sputter cleaning, the uniform high density ion flux generated by induction plasma source 1 provides, in combination with a suitable high frequency bias applied to the wafer 32, a gentle, low voltage argon sputter particularly suitable for the removal of thin oxides and contaminants prior to the deposition of thin metal films. This gentle, low voltage argon ion sputter clean avoids gate damage that could occur during contact cleaning at higher energies. The argon ion sputter clean is also advantageously used to remove thin native oxides in contacts and vias, including those down to the silicon substrate, which provides for decreased contact resistance to the first level layer due to the removal of native oxide as well as the reduction in the amorphization of the silicon surface.

Figure 6:
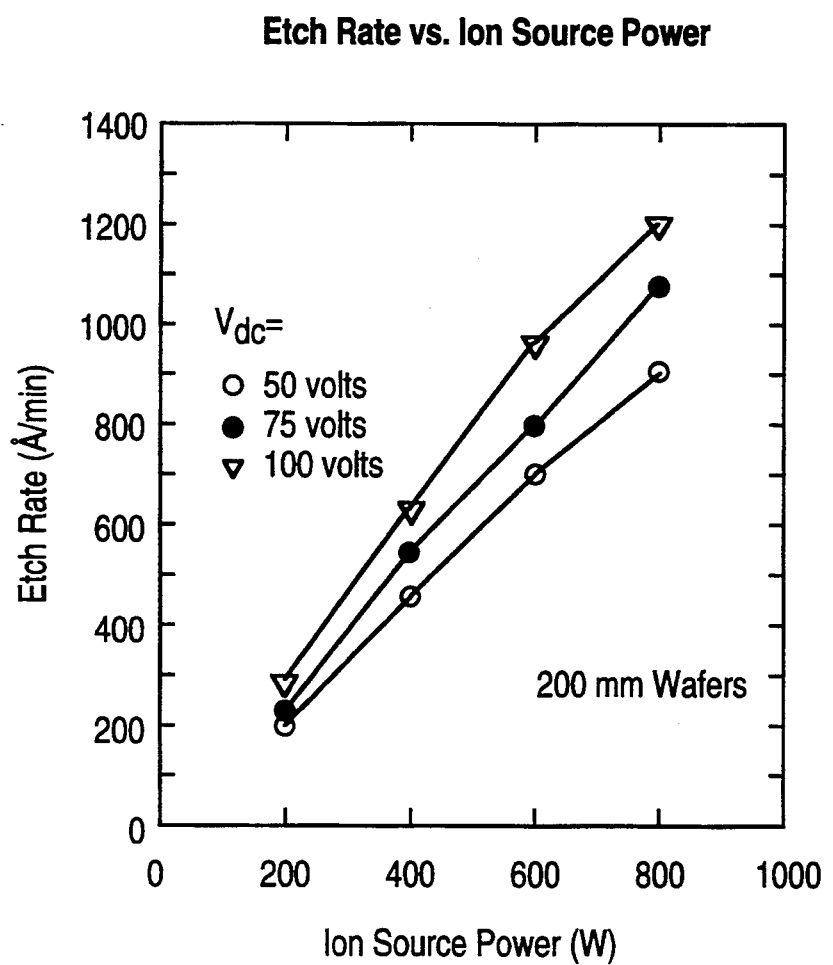
FIG. 6 is a graph of etch rate versus ion source power for the hemispherical induction ion source of FIG. 1.
Figure 7:
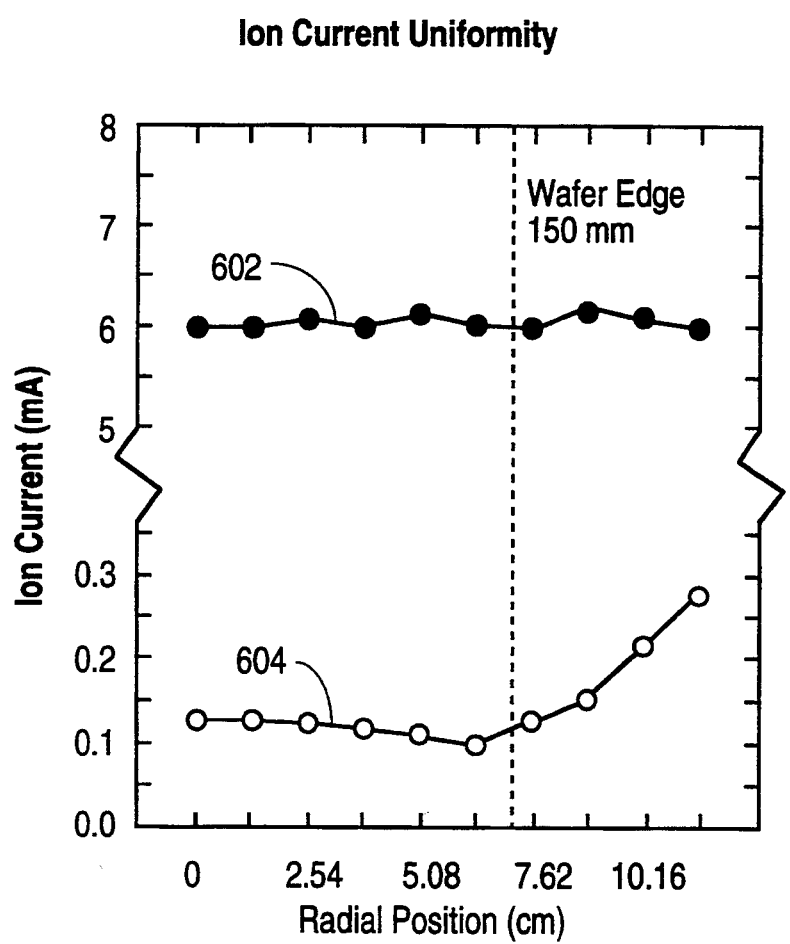
FIG. 7 is a graph of ion current uniformity for the hemispherical induction ion source of FIG. 1 and a standard diode etch apparatus.

Illustrative characterization data is presented in FIGS. 6 and 7. FIG. 6 is a graph of etch rate as expressed in angstroms/minute versus ion source power as expressed in watts for various wafer bias voltages ($V_{dc}$= −50 V, −75 V, −100 V), the hemispherical induction plasma source 1 operating on thermal oxide wafers at a pressure of 0.6 mTorr of argon. The actual sheath potential (total voltage scene at the wafer surface) is approximately 30 volts greater than the wafer bias voltage. FIG. 6 shows that high etch rates are achieved at very low voltage levels. At 200 watts ion source power (source 410), an etch rate of about 250 Å/min is achieved for a wafer bias voltage of −100 volts, decreasing only to about 200 Å/min (about 20% decrease) at a wafer bias voltage of −50 volts (50% decrease). At 400 watts ion source power, an etch rate of about 600 Å/min is achieved for a wafer bias voltage of −100 volts, decreasing only to about 450 Å/min (about 25% decrease) at a wafer bias voltage of −50 volts (50% decrease). At 600 watts ion source power, an etch rate of about 950 Å/min is achieved for a wafer bias voltage of −100 volts, decreasing only to about 700 Å/min (about 26% decrease) at a wafer bias voltage of −50 volts (50% decrease). At 800 watts ion source power, an etch rate of about 1200 Å/min is achieved for a wafer bias voltage of −100 volts, decreasing only to about 900 Å/min (about 25% decrease) at a wafer bias voltage of −50 volts (50% decrease).

FIG. 7 is a graph expressing ion current uniformity as a function of ion current in milliamperes versus radial position in centimeters. Curve 602 represents the ion current across a wafer in a sputter clean process using the hemispherical induction ion source of FIG. 1 at a pressure of 0.6 mTorr of argon and a wafer bias voltage of minus 100 volts. Ion current varies only about +/−1.1%. Not only is the ion current above the pedestal 40 uniform, but the ion current is quite high at about 6 mA, even despite the low pressure operation at 0.6 mTorr. Curve 604 represents the ion current across a wafer in an sputter clean process using a conventional diode etch at a pressure of 20 mTorr and a wafer bias voltage of minus 700 volts. Ion current varies about +/−12.9%.

Hence, when used with dual power supplies to independently control the ion-current and the ion energy at the wafer surface, the hemispherical induction plasma source 1 allows high etch rates to be achieved while minimizing the total voltage seen at the wafer 32. High ion densities of greater than $1 \times 10^{11}$ (ions/cm$^3$) yield excellent etch rates of greater than or equal to 300 angstroms/minute for thermal oxides at total wafer voltages of less than 150 volts.

To understand the reasons for the significantly improved results achieved by the relatively simple hemispherical induction plasma source 1, consider first the general principle that both gas pressure and frequency have an effect on sheath potentials. As pressure is lowered below about 50 or 100 mTorr, the sheath thickness and voltage across the sheath begin to increase in many plasma systems from tens of volts to hundreds of volts or more, as typified by the diode etch characterization shown in curve 604 of FIG. 7. Correspondingly, the plasma potential goes up and the ion-substrate bombardment energy rises sharply with decreasing pressure. These effects are a consequence of longer mean free paths and reduced collision rates between electrons and molecules. Electron energy and potentials increase in order to raise the probability of ionization and sustain the plasmas, despite the lower collision rates. Lower rf excitation frequency has a similar influence on diode systems. When gas pressure is in the range of about 100 to 1000 mTorr and frequency is lowered from about 10 MHz to less than about 1 MHz, once again sheath potentials increase dramatically and favor energy-driven ion assisted etching. The potential increase is attributed to a change in the plasma sustaining mechanism.

Hence, in general terms for diode systems, frequency and pressure are interchangeable variables, and either low frequency or low pressure increases sheath potentials, which helps sustain the plasma, but which also tends to damage the substrate and cause gate damage in MOSFET devices. For this reason, a more efficient method of ionization should be employed.

The hemispherical induction source 1 achieves a gentle, low voltage, high rate argon ion sputter clean at low pressure that avoids gate damage that could occur during contact cleaning at the higher energies typically observed with other plasma sources. We believe that the advantageous performance characteristics of the hemispherical induction plasma source 1 can be explained as follows. Induction discharges are sustained in the induction plasma source 1 during low pressure operation (e.g. 0.6 mTorr and below) by the induced azimuthal electric field near the wall of the vessel 20. The oscillating current in the excitation coil produces an axial, time-varying magnetic field which induces an oscillating azimuthal electric field. Electrons entering the region within the plasma boundary near the induction coil 18 are accelerated azimuthally and produce an electric current opposite to that in the induction coil 18. This results in the axial magnetic field being mostly cancelled in the interior of the plasma discharge. Consequently, the magnitude of the electric field is very low in the interior of the chamber 30.

The exterior part of the plasma near the induction coil 18 is the main region in which energy is transferred to the plasma electrons. These electrons rapidly diffuse through the plasma volume due to the elastic scattering collisions with the atoms of the gas. The electrons, which have energy of about 20 eV, make ionizing collisions with atoms throughout the chamber 30. In the induction plasma source 1, at gas pressures well below a milliTorr (e.g. 0.6 mTorr) the likelihood is that about 1 collision per ion occurs from creation of the ion to when it hits the wall after a mean free path of average length of about 10 cm, which is essentially a free fall to the wall. Contrast the low pressure case from the case at higher pressures of several milliTorr, when more than 10 collisions occur over such a path length. In this case, the ions diffuse to the wall.

The spatial dependence of the ionization rate is highly dependent on the pressure and electron mean free path for scattering, since the electrons are energized at the outer wall near the induction coil 18. When the pressure is very low (0.6 mTorr), the mean free path for the electrons is such that they normally transit the vessel without a collision. However, the path length of the electron in the inductive field is increased more than 100 times that of an electron moving in the electric field of a diode (parallel plate) system of comparable size.

The inductive source also allows ionization events to occur in a very large volume (at the perimeter) which contrasts to the diode ionization mechanism which occurs mostly at the sheath boundary through "wave riding" and secondary injection. One might explain the very uniform ion current above the electrode as follows. The likelihood of an electron making ionizing collisions is smaller in the center than nearer the walls since they need not pass through the center. Nonetheless, since the height of the plasma column above the center is greatest, the current falling on the center of the electrode is nearly equal to that falling on the edge where the plasma column is not so tall but where the ionization rate is larger.

The sputter rate is dependent on the high frequency bias voltage. The observed sputter rates for, e.g., $SiO_2$ correlates well with the ion current density because the sheath potential is quite constant over the surface of the wafer 32 and the sputter rate is simply the product of the ion current density and the sputter efficiency, which is a function of the ion energy. The sheath potential is shown to be uniform because the time averaged potential in the plasma just above the electrode surface of the pedestal 40 (at about 1.9 cm) is constant over the area of the pedestal electrode, while the potential on the pedestal electrode surface itself is independent of position. The sheath potential, therefore, which is the difference of the plasma and electrode surface potentials, is also essentially uniform.

While the invention has been described with respect to the embodiments set forth above, the invention is not necessarily limited to these embodiments. Accordingly, other embodiments, variations and improvements not described herein are not necessarily excluded from the scope of the invention, which is defined by the following claims.

What is claimed is:

1. A plasma process apparatus for integrated circuit fabrication having a chamber and a platen for supporting on a surface thereof a substrate in the chamber, comprising:
   a hemispherically shaped induction coil having multiple windings proceeding from an equatorial base to a pole of the hemispherically shaped induction coil generally parallel to the support surface of the platen, the chamber being disposed inside the induction coil;
   a radio frequency power source coupled to the induction coil; and
   a bias power source coupled to the platen.

2. An apparatus as in claim 1, wherein the windings of the induction coil are a copper tube, further comprising a cooling system for furnishing a cooling fluid to one end of the copper tube and for removing cooling fluid from the other of the copper tube.

3. An apparatus as in claim 1 wherein the chamber is contained within a hemispherical vessel and the induction coil.

4. An apparatus as in claim 3 wherein the vessel is a quartz bell jar.

5. An apparatus as in claim 3 wherein the vessel is an aluminum oxide bell jar.

6. An apparatus as in claim 3, wherein the windings of the induction coil are a copper tube, further comprising a cooling system for furnishing a cooling fluid to one end of the copper tube and for removing cooling fluid from the other of the copper tube.

7. An apparatus as in claim 6 wherein the windings of the induction coil are packed in a thermally conductive dielectric material and the thermally conductive dielectric material couples the induction coil to the vessel.

8. An apparatus as in claim 1 wherein the bias power source is a high frequency radio frequency power source.

9. An apparatus as in claim 1 wherein the radio frequency power source is a low frequency radio frequency power source.

10. An apparatus as in claim 1 wherein a plasma is operably sustainable in the chamber generally above the platen in a pressure as low as 0.6 milliTorr.

11. A plasma process apparatus for integrated circuit fabrication having a chamber and a platen for supporting on a surface thereof a substrate in the chamber, comprising:
   a vessel having a hemispherical quartz wall which contains the chamber;
   a low frequency radio frequency power source which induces a low frequency oscillating azimuthal electric field in a region near the quartz wall so that electrons entering the region within the plasma boundary are accelerated and cancel an axial magnetic field in the interior of the plasma discharge; and
   a high frequency radio frequency power source which imposes a biasing voltage on the wafer independently of the low frequency radio frequency power source.

12. A plasma process apparatus for integrated circuit wafer fabrication, comprising:
   a housing having a top plate;
   a bell jar having a hemispherical quartz wall, the bell jar being mounted on the top plate and containing a vacuum chamber;
   a platen having a top wafer-supporting surface;
   a hemispherical induction coil disposed about the quartz wall of the bell jar, the induction coil having a plurality of windings proceeding from an equatorial base to a pole of the hemispherically shaped induction coil generally parallel to the platen;
   a gas system coupled to the chamber;
   a radio frequency power source connected to one end of the induction coil through a matching network and the other end of the induction coil being connected to the housing; and
   a high frequency radio frequency power source connected to the platen through a matching network.

13. An apparatus as in claim 12 wherein the windings of the induction coil form a single hemispherically shaped expanding spiral layer having an internal volume sufficiently large to contain the bell jar.

14. An apparatus as in claim 12 wherein the windings of the induction coil are a copper tube, further comprising a cooling system for circulating a cooling fluid through the copper tube to cool the induction coil.

15. An apparatus as in claim 14 wherein the windings of the induction coil are packed in a thermally conductive dielectric material and the thermally conductive dielectric material couples the induction coil to the bell jar.

16. An apparatus as in claim 12 wherein a plasma is operably sustainable in the vacuum chamber at a gas pressure therein as low as 0.6 milliTorr.

17. An apparatus as in claim 12 wherein a plasma is operably sustainable in the vacuum chamber at a gas pressure therein as low as 0.1 milliTorr.

18. A method of generating a plasma for processing an integrated circuit substrate comprising the steps of:
   placing the substrate in a chamber contained within a hemispherical induction coil;
   delivering a gas to the chamber;
   applying an oscillating current to the induction coil so that a plasma is formed by excitation of the gas in the chamber; and
   imposing a biasing voltage on the substrate.

19. A method as in claim 18 further comprising the step of sustaining in the chamber a gas pressure therein as low as 1.0 milliTor.

20. A method as in claim 18 wherein:
   the imposing step includes the step of applying a high frequency radio frequency power source to the substrate; and
   the applying step includes the step of applying a low frequency radio frequency power source to the coil.

21. A method as in claim 18 wherein:
   the plasma process is an ion sputter process; and
   the delivering step includes delivering an inert gas to the chamber at low pressure to remove material from the substrate surface by momentum transfer.

22. A method as in claim 18, wherein:
   the plasma process is a chemical etching procedure; and
   the delivering step includes delivering a reactive gas at a high pressure to the substrate from multiple gas sources arranged radially symmetrical thereabout.

23. A method as in claim 18, wherein:
   the plasma process is a plasma-enhanced chemical vapor deposition (PECVD) procedure; and
   the delivering step includes delivering a reactive gas to the substrate.

24. A method as in claim 23, wherein the delivering step includes delivering the reactive gas at a high pressure to the substrate.

25. A method as in claim 23, wherein the delivering step includes delivering the reactive gas to the substrate from multiple gas sources arranged radially symmetrical thereabout.

26. A method as in claim 18, further comprising the step of evacuating the chamber to a pressure less than atmospheric pressure prior to the delivering step.

27. A method as in claim 18, wherein the induction coil is a copper tube and the method further comprises the step of circulating a cooling fluid through the tube.

28. A method as in claim 27 further comprising the step of packing the windings of the induction coil in a thermally conductive dielectric material.

29. A method as in claim 27 wherein the chamber is contained within a hemispherical vessel and the thermally conductive dielectric material couples the induction coil to the bell jar.

30. A chamber housing of a plasma process apparatus for integrated circuit fabrication, comprising:
   a vessel disposed about a chamber;
   an induction coil disposed about the vessel and having multiple windings of a copper tube;
   a cooling system furnishing a cooling fluid to one end of the copper tube and removing cooling fluid from the other of the copper tube; and
   a thermally conductive dielectric material packing the windings of the induction coil and coupling the induction coil to the vessel.

31. A housing as in claim 29 wherein the vessel and the induction coil are hemispherically shaped and the multiple windings of the induction coil wind from an equatorial base to a pole of the hemispherically shaped induction coil.

* * * * *